(12) United States Patent
Corliss et al.

(10) Patent No.: US 7,807,335 B2
(45) Date of Patent: Oct. 5, 2010

(54) IMMERSION LITHOGRAPHY CONTAMINATION GETTERING LAYER

(75) Inventors: Daniel A. Corliss, Hopewell Junction, NY (US); Dario Gil, Pleasantville, NY (US); Dario Leonardo Goldfarb, Mohegan Lake, NY (US); Steven John Holmes, Guilderland, NY (US); David Vaclav Horak, Essex Junction, VT (US); Kurt Rudolf Kimmel, Waterford, NY (US); Karen Elizabeth Petrillo, Mahopac, NY (US); Dmitriy Shneyder, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 1334 days.

(21) Appl. No.: 11/144,857

(22) Filed: Jun. 3, 2005

(65) Prior Publication Data

US 2006/0275706 A1    Dec. 7, 2006

(51) Int. Cl.
  G03F 7/26    (2006.01)
(52) U.S. Cl. .................. 430/311; 430/327; 430/961
(58) Field of Classification Search ............. 430/322, 430/330, 327, 961
  See application file for complete search history.

(56) References Cited

U.S. PATENT DOCUMENTS

2002/0137329 A1   9/2002  Fang et al.
2005/0059086 A1*  3/2005  Huang et al. ............... 435/7.1
2005/0069819 A1*  3/2005  Shiobara .................... 430/327
2005/0089802 A1*  4/2005  Vander Aa ................. 430/302
2005/0202351 A1*  9/2005  Houlihan et al. .......... 430/322

OTHER PUBLICATIONS

Zalkov et al.; Diffusion of Electrolytes in Polymers; New Concepts in Polymer Science; pp. 92-93, 1988.
Ohmi et al.; Metallic Impurities Segregation at the Interface Between Si Wafer and Liquid during Wet Cleaning; J. Electrochem. Soc., vol. 139, No. 11; Nov. 1992; The Electrochemical Society Inc; pp. 3317-3335.

* cited by examiner

Primary Examiner—Kathleen Duda
Assistant Examiner—Brittany Raymond
(74) Attorney, Agent, or Firm—Schmeiser, Olsen & Watts; Wenjie Li

(57) ABSTRACT

A method of forming an image in a photoresist layer. The method includes, providing a substrate; forming the photoresist layer over the substrate; forming a contamination gettering topcoat layer over the photoresist layer, the contamination gettering topcoat layer including one or more polymers and one or more cation complexing agents; exposing the photoresist layer to actinic radiation through a photomask having opaque and clear regions, the opaque regions blocking the actinic radiation and the clear regions being transparent to the actinic radiation, the actinic radiation changing the chemical composition of regions of the photoresist layer exposed to the radiation forming exposed and unexposed regions in the photoresist layer; and removing either the exposed regions of the photoresist layer or the unexposed regions of the photoresist layer. The contamination gettering topcoat layer includes one or more polymers, one or more cation complexing agents and a casting solvent.

22 Claims, 4 Drawing Sheets

IMMERSION LITHOGRAPHY CONTAMINATION GETTERING LAYER

FIELD OF THE INVENTION

The present invention relates to the field of integrated circuit fabrication; more specifically, it relates integrated circuit manufacture utilizing immersion photolithography technology.

BACKGROUND OF THE INVENTION

As the size of structures of advanced integrated circuits has decreased, manufacturers are turning to a micro-lithography technique called immersion lithography, because of its improved resolution capability. In immersion lithography, an immersion fluid is placed between the optical lens and a photoresist layer. The immersion fluid provides considerably higher depth-of-focus than conventional photoirradiation in air, therefore facilitating the use of high-numerical-aperture optical designs, which enable enhanced resolution during photoresist patterning. However, there are two problems associated with immersion lithography. The first problem is that in many photoresist systems, components of the photoresist leach out into the immersion fluid and/or the immersion fluid penetrates into the photoresist thus degrading performance. The second problem is that trace contaminants present in the immersion fluid can leach into the photoresist layer and ultimately contaminate various structures in the integrated circuits, degrading yield and/or reliability. Therefore, there is a need for a method to prevent interaction between photoresist layers and immersion fluid in an immersion lithography system and to prevent or reduce contaminants in the immersion fluid from contaminating the integrated circuit being fabricated.

SUMMARY OF THE INVENTION

A first aspect of the present invention is a method of forming an image in a photoresist layer, providing a substrate; forming the photoresist layer over the substrate; forming a contamination gettering topcoat layer over the photoresist layer, the contamination gettering topcoat layer including one or more polymers and one or more cation complexing agents; exposing the photoresist layer to actinic radiation through a photomask having opaque and clear regions, the opaque regions blocking the actinic radiation and the clear regions being transparent to the actinic radiation, the actinic radiation changing the chemical composition of regions of the photoresist layer exposed to the radiation forming exposed and unexposed regions in the photoresist layer; and removing either the exposed regions of the photoresist layer or the unexposed regions of the photoresist layer.

A second aspect of the present invention is a contamination gettering topcoat material, comprising: one or more polymers; one or more cation complexing agents; and a casting solvent.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

For the purposes of the present invention, the term cation includes positively charged ions of metals and non-metals.

Figure 1:
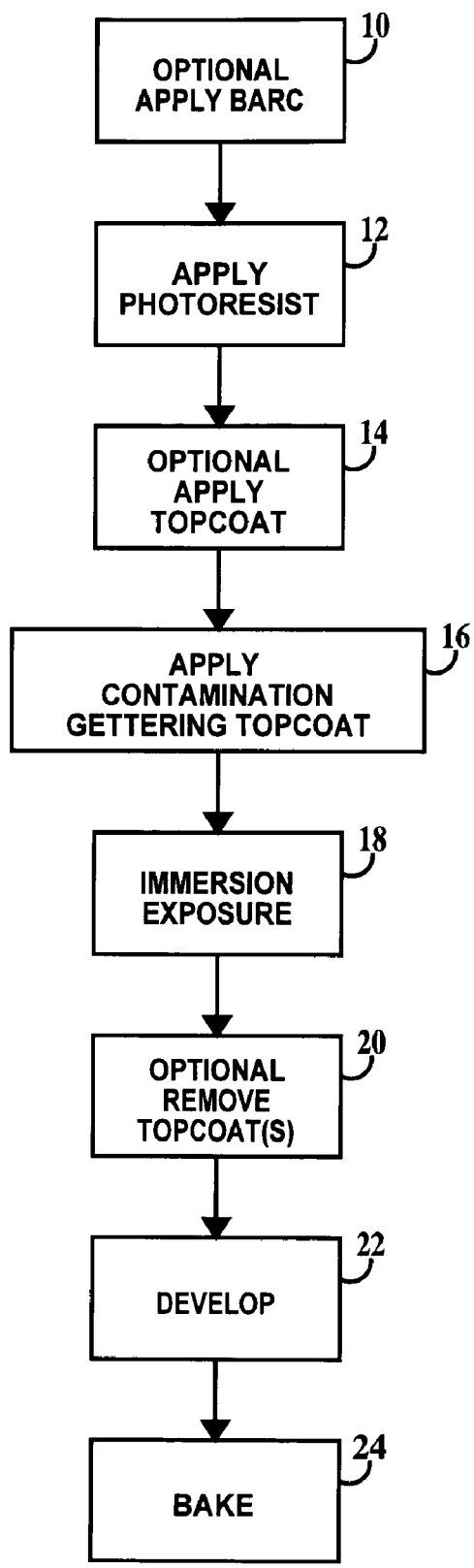
FIG. 1 is flowchart of process steps according to the present invention.

FIG. 1 is flowchart of process steps according to the present invention. In step 10 a substrate having a layer to be patterned is optionally coated with a bottom antireflective coating (BARC), examples of which include, but are not limited to polyester and acrylate-based layers such as ARC®28 (Brewer Science), AR40 (Rohm and Haas) and ArF-1C5D (AZ Clariant). In step 12, a photoresist layer is formed on top of the BARC if present or on top of the layer to be patterned if a BARC is not present. In step 14, a sealing topcoat layer that provides protection only against immersion fluid penetrating the photoresist layer and components of photoresist layer leaching into immersion fluid is optionally applied, examples of which include, but are not limited to polymethylmethacrylate. Examples of a suitable casting solvent for this optional sealing topcoat layer include, but are not limited to, anisole and chlorobenzene. In step 16, a contamination gettering topcoat layer is applied. There are four methods of forming a contamination gettering topcoat layer.

In a first method, one or more water soluble cation complexing agents are mixed with one or more water soluble polymers and spin applied using a casting solvent comprising water, a water alcohol mixture or alcohol. In the first method, the cation complexing agents are independent materials from the water soluble polymer. In one example, the casting solvent is immiscible with the photoresist layer or an underlying non-contamination gettering topcoat layer. A water soluble polymer is a polymer that is soluble in water having a pH of about 5 to about 9. The polymer/cation complexing agent mixture is spun applied and than baked, for example, at a temperature between about 100° C. and about 130° C. The baking has two effects. First the baking drives out the casting solvent to form a film of comprising cation complexing agent(s) in a matrix of polymer. Second the baking converts the water soluble polymer to a form that is not soluble in the immersion fluid of a lithographic immersion system. In the example of the immersion fluid being water, the water soluble polymer is converted to a non water soluble polymer. However, the non water soluble polymer may be soluble in photoresist developer, including basic aqueous developers.

An example of a suitable water soluble polymer is, but is not limited to, MMA-MAANH4-TBMA copolymer (MMA: methyl methacrylate; MAANH4: methacrylic acid, ammonium salt; TBMA: tert-butyl methacrylate). Example of suitable alcohols include, but are not limited to, 1-butanol, methanol, ethanol, 1-propanol, 1-pentanol, 2-methyl-4-pentanol and n-hexanol. Examples of suitable water soluble cation complexing agents include is not limited to, trans-1,2 diaminocyclohexane-N,N,N',N'-tetraacetic acid monohydrate (structure I) which complexes cations of Cu and Ni, diethylenetriaminepentaacetic acid (structure II) which complexes cations Fe, Mn, Cu and Ca, 1,2-diaminoethane-N,N,N',N'-tetrakis(methylenephosphoric acid) (structure III) which complexes cations Ca, Ni and Cu, nitriloacetic acid (structure IV) which complexes cations Ca, K, Na, Cu, Fe, Mn and Ni, ethylenediaminetetraacetic acid (EDTA) (structure V) which complexes cations Ca, Mn, Fe, Cu and Ni, and phytic acid (structure VI) which complexes cations K, Cu, Mn, Ca, Fe and Ni.

In one example, the coated and baked polymer/cation complexing agent mixture comprises about $10^{-4}$ mol % to about 0.05 mol % of cation complexing agent relative to polymer.

In a second method, one or more organic solvent soluble cation complexing agents are mixed with one or more organic solvent soluble polymer and spin applied using an organic solvent. In the second method, the cation complexing agents are independent materials from the organic solvent soluble polymer. In one example, the organic solvent is immiscible with the photoresist layer or and underlying non-contamination gettering topcoat layer. The polymer/cation complexing agent mixture is spun applied and may be optionally baked. The baking drives out the casting solvent to form a film of comprising cation complexing agent(s) in a matrix of polymer. In some examples, baking is not needed as the casting solvent will evaporate upon exposure to ambient atmosphere and temperature. The organic solvent soluble polymer may be soluble in photoresist developer, including basic aqueous developers.

Examples of a suitable organic solvent soluble polymers includes, but are not limited to hexafluoroalchol-subsituted cyclooefin based polymers, fluorosulfonamide-subsituted cycloolefins based polymers, acrylate based polymers and methacrylate based polymers. Example of suitable organic solvents includes, but are not limited to, 1-butanol, methanol, ethanol, 1-propanol, 1-pentanol, 2-methyl-4-pentanol and n-hexanol. Examples of suitable solvent soluble cation complexing agents include is not limited to 1,4,8,12-tetraazacyclopentadecane (structure VII) which complexes cations of Fe, Mn, Ni and Cu, acetylacetone (structure VIII) which complexes cations of Fe, Co, Ca, Mn, Ni, K and Na, 18-crown-6 ether (structure IX) which complexes cations of K and $NH_4$, ammonium pyrrolidine dithiocarbamate (structure X) which complexes cations of Cu, Fe, Mn and Ni, di-2-pyridyl ketone oxime (structure XI) which complexes cations of Cu and Co, 4-benzoyl-3methyl-1-phenyl-2-pyrazolin-5-one (structure XII) which complexes cations of Cu and Mn, and valinomycin (structure XIII) which complexes cations of K.

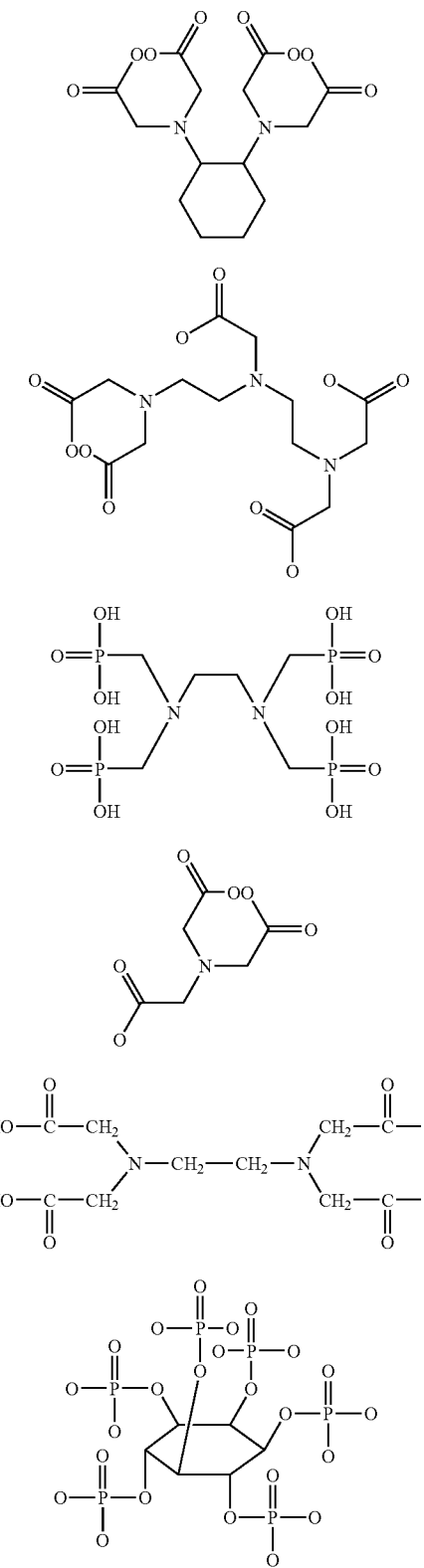

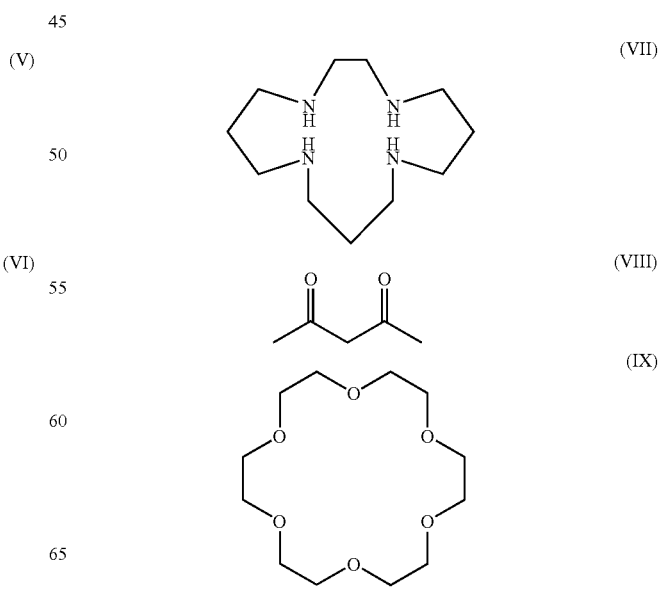

-continued

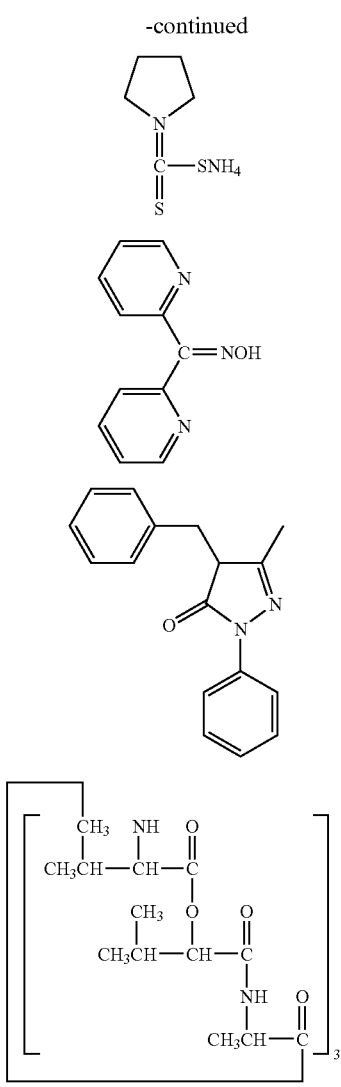

In one example, the polymer/cation complexing agent mixture comprises about $10^{-4}$ mol % to about 0.05 mol % of cation complexing agent relative to polymer.

In a third method, a co-polymer comprising two or more polymers is spin applied using a casting solvent. In the third method, the cation complexing agents are pendent groups attached to one or more of the polymers. In one example, the casting solvent is immiscible with the photoresist layer or an underlying non-contamination gettering topcoat layer. In one example, the casting solvent is 1-butanol, methanol, ethanol, 1-propanol, 1-pentanol, 2-methyl-4-pentanol, n-hexanol or other alcohols. At least one of the co-polymers (structure XIV) includes a pendent group $R_1$ that is miscible with the casting solvent and at least one co-polymer includes a pendent group $R_2$ that complexes cations.

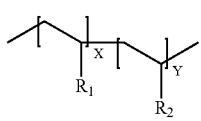

When the backbone polymers are acrylates, $R_1$=structure (XV) and $R_2$=structure (XVI) the resultant copolymer is poly(bis-hexafluoroalcoholcyclohexane-co-trans-1,2-diaminocyclohexane-N,N,N',N'-tetraacetic acid)acrylate which complexes cations of Cu and Ni.

When the backbone polymers are acrylates, $R_1$=structure (XV) and $R_2$=structure (XVII) the resultant copolymer is poly(bis-hexafluoroalcholcyclohexane-co-bis(cyclohexanone)oxaldihydrazone)acrylate which complexes cations of Cu.

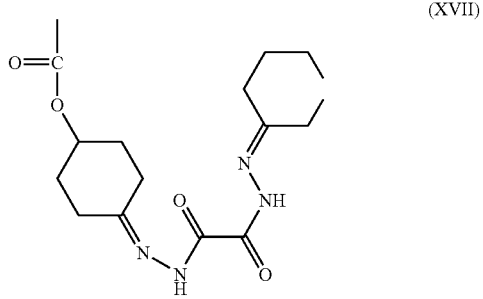

When backbone polymers are acrylates, $R_1$=structure (XV) and $R_2$=structure (XVIII) the resultant copolymer is poly(bis-hexafluoroalcholcyclohexane-co-1,2-cyclohexanedione dioxime)acrylate which complexes cations of Fe and Ni.

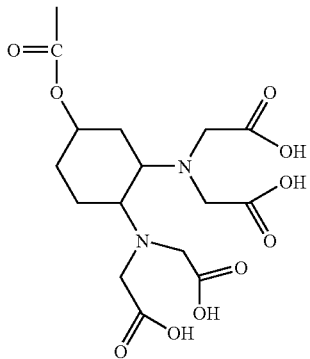

(XVIII)

In a fourth method a polymer having a pendent group $R_3$ (structure XIX) that is both miscible with the casting solvent and complexes cations is dissolved in a casting solvent and spun applied.

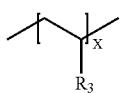

(XIX)

In one example, the casting solvent is immiscible with the photoresist layer or an underlying non-contamination gettering topcoat layer. In one example, the casting solvent is 1-butanol, methanol, ethanol, 1-propanol, 1-pentanol, 2-methyl-4-pentanol, n-hexanol or other alcohols. When the backbone polymer is polyethylene and $R_3$=structure XX, the resultant polymer polyethylene amidoxime which complexes cations of Cu.

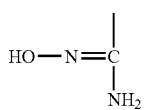

(XX)

Returning to FIG. 1, in step 18, an immersion fluid is formed over the topcoats and the photoresist layer is exposed to actinic radiation of a wavelength that photoresist layer is sensitive to. In step, 20, one or both of the topcoats is optionally removed. In step 22, the photoresist is developed to form patterns of photoresist. If one or both of the topcoats were not removed in step 20, they are removed in step 22. In step 24 an optional post-develop bake is performed.

Figure 2A:
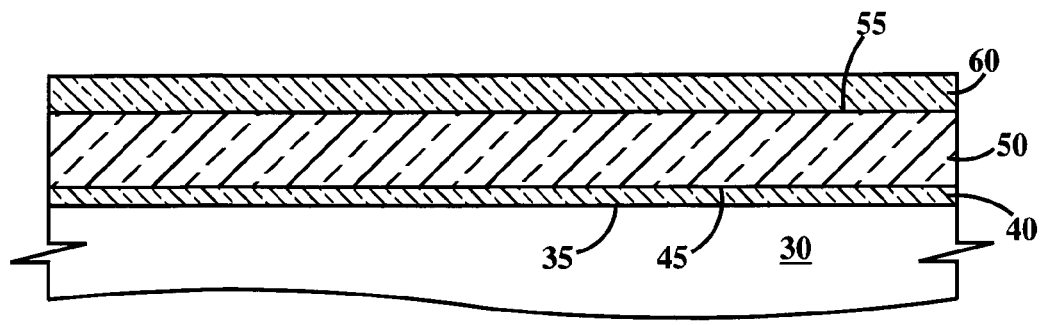
FIGS. 2A through 2C are cross-sectional views illustrating a semiconductor manufacturing process using a single topcoat layer according to the present invention.
Figure 2B:
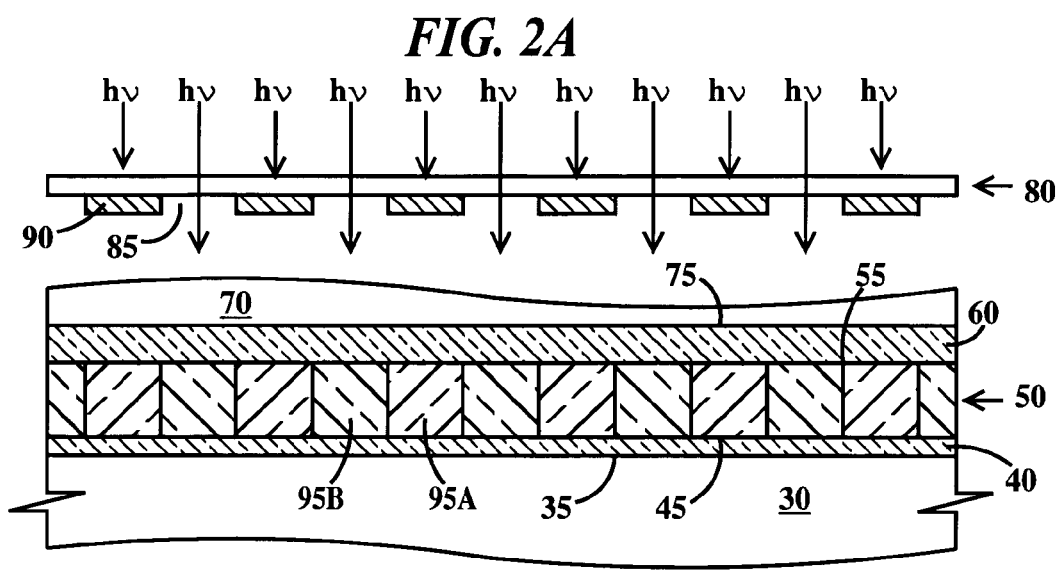
Figure 2C:
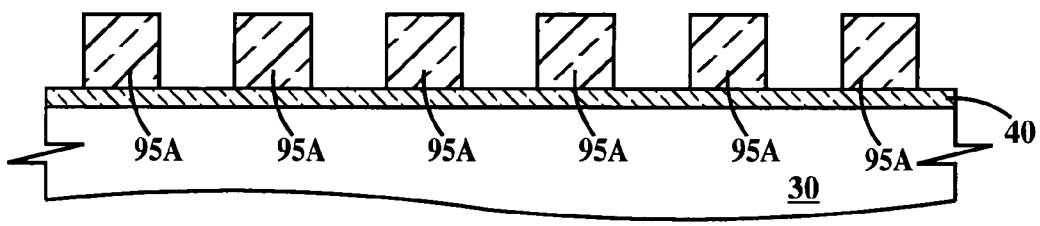

FIGS. 2A through 2C are cross-sectional views illustrating a semiconductor manufacturing process using a single topcoat layer according to the present invention. In FIG. 2A, a substrate 30 is provided. In one example, substrate 30 is a semiconductor substrate. Examples of semiconductor substrates include but are not limited to bulk (single crystal) silicon wafers and silicon on insulator (SOI) wafers. Formed on a top surface 35 of substrate 30 is an optional BARC 40. In one example, BARC 40 is spin applied and a post BARC apply bake (heated above room temperature to remove most of the BARC solvent) performed. Formed on a top surface 45 of BARC 40 is a photoresist layer 50. BARC 40 may comprise any of the materials described supra in reference to step 10 of FIG. 1. In one example, photoresist layer 50 is spin applied and a post photoresist apply bake, also known as a pre-exposures bake or a pre-bake (heated above room temperature to remove most of the photoresist solvent) performed. In one example, photoresist layer 50 comprises an acrylate-based or methacrylate-based photoresist. Next a contamination gettering topcoat layer 60 is formed on a top surface 55 of photoresist layer 50. Contamination gettering topcoat layer 60 may comprise materials and be formed by any of methods described supra in reference to step 16 of FIG. 1. In one example contamination gettering topcoat layer 60 is about 30 nm to about 150 nm thick.

Figure 4:
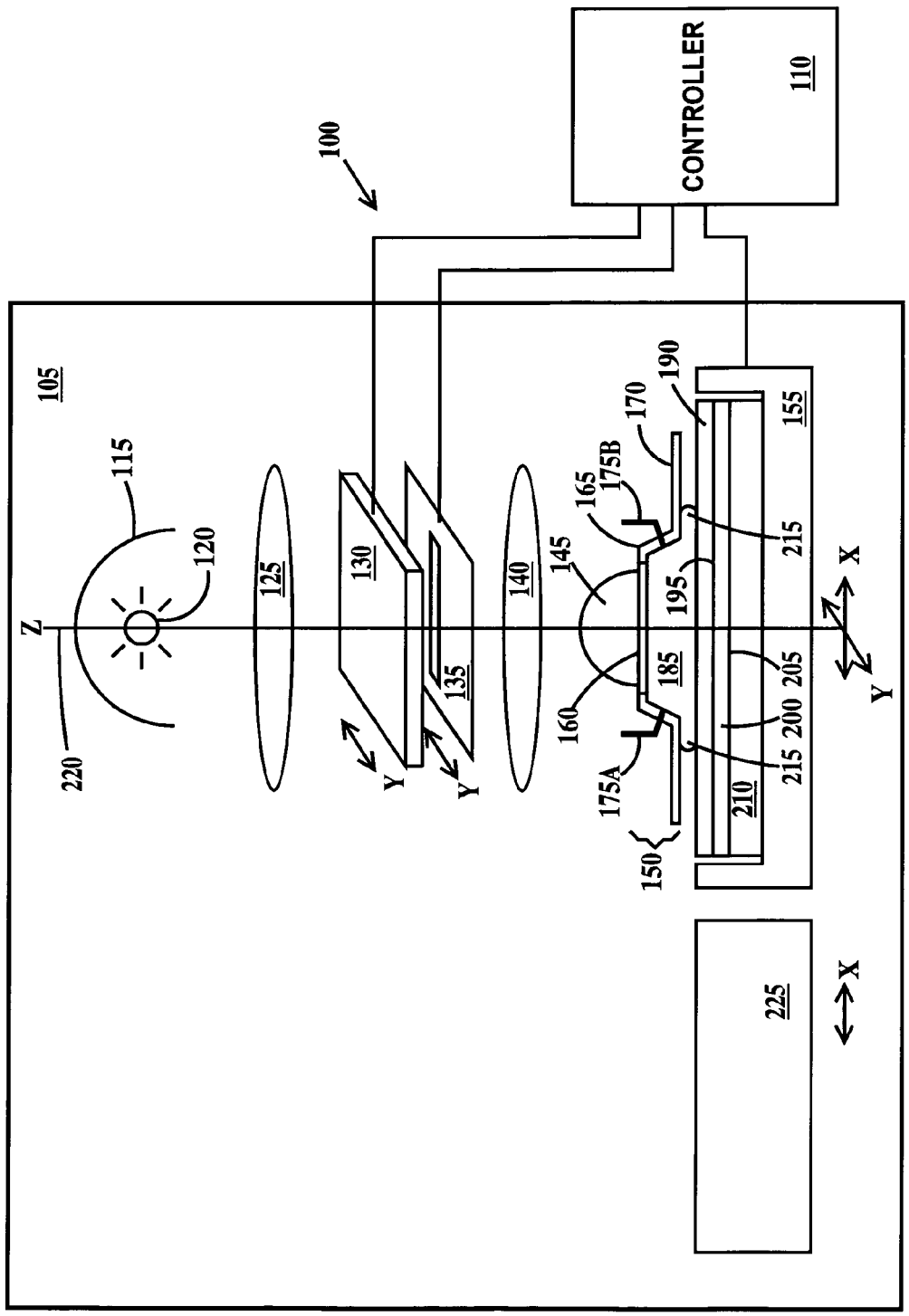
FIG. 4 is a diagram of an exemplary immersion photolithographic system that may be used to process a semiconductor wafer having a contamination getting topcoat layer according to the present invention.

In FIG. 2B, a layer of immersion fluid 70 is formed over a top surface 75 of contamination gettering topcoat layer 60 in an immersion photolithography tool (see FIG. 4 and description infra). An example of an immersion fluid is water, with or without additives. Actinic radiation of a wavelength that photoresist layer 50 is sensitive to is passed through a photomask 80. Photo mask 80 has clear regions 85 that transmit the actinic radiation and opaque regions 90 that block the actinic radiation. Exposure of photoresist layer 50 to actinic radiation through mask 80 forms unexposed regions 95A of photoresist layer 50 and exposed regions 95B of photoresist layer 50. Exposed regions 95B are also known as latent image regions. In one example, the actinic radiation is light having a wavelength of 157 nm, 193 nm or 248 nm and contamination gettering topcoat layer 60 is substantially transparent to the actinic radiation, (i.e. having a k<0.01 where k is the imaginary component of the complex refractive index). An optional post exposure bake (heated above room temperature to drive the photoresist chemistry) may be performed.

Although a positive photoresist is shown in FIG. 2B, the present invention works equally well with negative photoresist systems or dual tone photoresist systems. In negative photoresist systems, the photoresist will develop away where it is not exposed to light, so a photomask of polarity opposite to that illustrated in FIG. 2B is required. Dual tone resists can act either negatively or positively depending upon the developer system used.

In FIG. 2C, substrate 30 is removed from the immersion photolithography tool and photoresist layer 50 developed to remove exposed regions 95B (see FIG. 2B) and leave behind unexposed regions 95A. In one example the developer comprises an aqueous solution of a base such as TMAH. Contamination gettering topcoat layer 60 (see FIG. 2B) is also removed by the developer. Optionally, contamination gettering topcoat layer 60 may be removed separately prior to development of the exposed photoresist layer 50. An optional post development bake, (heated above room temperature to harden the photoresist images) may be performed.

While the exposure of the photoresist layer was described in the context of an immersion photolithography system, the topcoat compositions of the present invention also have utility in conventional (non-immersion) photolithography system as illustrated by the comparison of FIGS. 2A and 2B described supra as a protective coating against environmental contamination from particulates, water vapor, and chemical vapors that could degrade the imaging process or cause imperfections in the photoresist images and ultimately yield or reliability defects in the fabricated product.

Figure 3A:
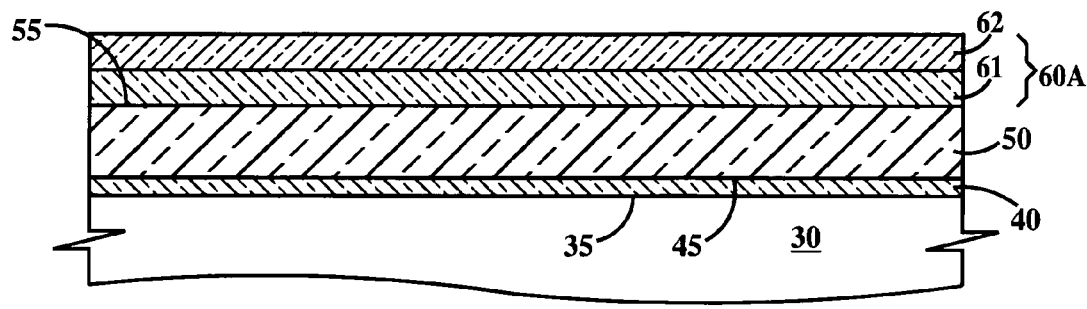
FIGS. 3A through 3C are cross-sectional views illustrating a semiconductor manufacturing process using a dual topcoat layer according to the present invention.
Figure 3B:
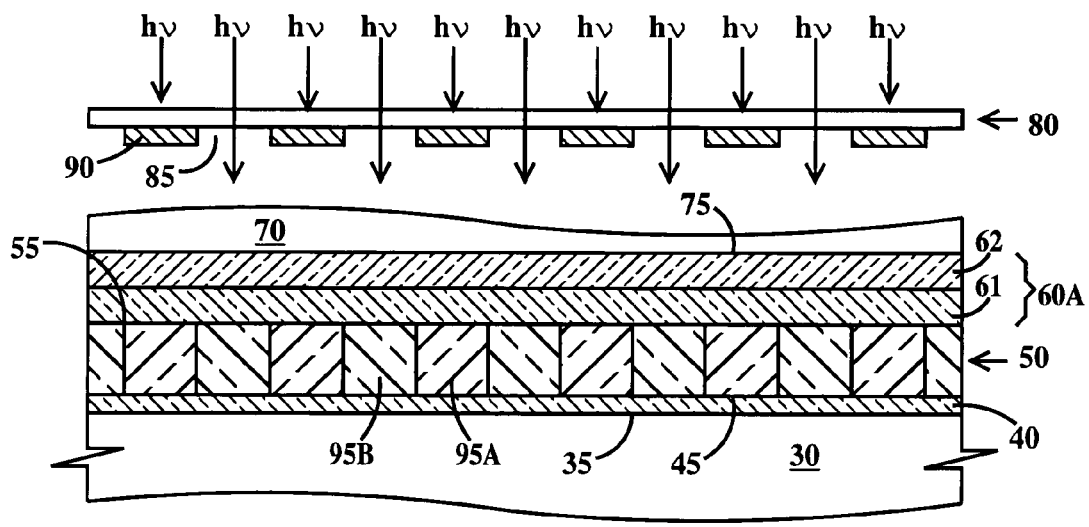
Figure 3C:
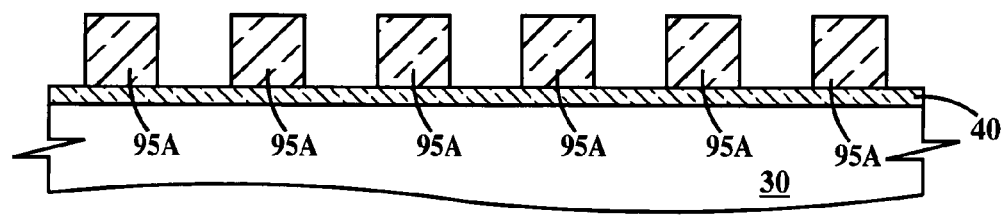

FIGS. 3A through 3C are cross-sectional views illustrating a semiconductor manufacturing process using a dual topcoat layer according to the present invention. FIGS. 3A and 3B are similar to FIGS. 2A and 2B except in FIGS. 2A and 2B, a contamination gettering topcoat layer 60A includes a lower sealing topcoat layer 61 and an upper contamination gettering topcoat layer 62. In a first example, lower sealing topcoat layer 61 provides protection against immersion fluid 70 (FIG.

3B) penetrating photoresist layer 50 and components of photoresist layer leaching into immersion fluid 70 (FIG. 3B) and upper contamination gettering topcoat layer 62 provides contamination gettering ability. In a second example, lower sealing topcoat layer 61 provides protection against immersion fluid 70 (FIG. 3B) penetrating photoresist layer 50 and components of photoresist layer leaching into immersion fluid 70 (FIG. 3B) and upper contamination gettering topcoat layer 62 provides contamination gettering ability and also provides protection against immersion fluid 70 (FIG. 3B) penetrating photoresist layer 50 and components of photoresist layer leaching into immersion fluid 70.

In one example, upper contamination gettering topcoat layer 62 may comprise materials and be formed by any of methods described supra in reference to step 16 of FIG. 1 and is identical to contamination gettering topcoat layer 60 of FIG. 2A described supra. In one example, lower topcoat layer 61 may comprise materials and be formed by any of methods described supra in reference to step 14 of FIG. 1.

FIG. 4 is a diagram of an exemplary immersion photolithographic system that may be used to process a semiconductor wafer having a topcoat layer according to the present invention. In FIG. 4, an immersion lithography system 100 includes a controlled environment chamber 105 and a controller 110. Contained within controlled environment chamber 105 is a focusing mirror 115, a light source 120, a first focusing lens (or set of lenses) 125, a mask 130, an exposure slit 135, a second focusing lens (or set of lenses) 140, a final focusing lens 145, an immersion head 150 and a wafer chuck 155. Immersion head 150 includes a transparent window 160, a central chamber portion 165, a surrounding plate portion 170, an immersion fluid inlet 175A and an immersion fluid outlet 175B. An immersion fluid 185 fills central chamber portion 165 and contacts a contamination gettering layer 190 (according to the embodiments of the present invention described supra) on a top surface 195 of a photoresist layer 200 on a top surface 205 of a wafer 210. Optionally, a BARC may formed on top surface 205 of wafer 210 under and in physical contact with photoresist layer 200. Optionally, an ARC may formed on top surface 195 of photoresist layer 200 under and in direct physical contact with contamination gettering layer 190. In one example, immersion fluid 185 includes water. Plate portion 170 is positioned close enough to contamination gettering layer 190 to form a meniscus 215 under plate portion 170. Window 160 must be transparent to the wavelength of light selected to expose photoresist layer 200.

Focusing mirror 115, light source 120, first focusing lens 125, a mask 130, exposure slit 135, second focusing lens 140, final focusing lens 145, immersion head 150 are all aligned along an optical axis 220 which also defines a Z direction. An X direction is defined as a direction orthogonal to the Z direction and in the plane of the drawing. A Y direction is defined as a direction orthogonal to both the X and Z directions. Wafer chuck 155 may be moved in the X and Y directions under the direction of controller 110 to allow formation of regions of exposed and unexposed photoresist in photoresist layer 200. As an XY-stage moves, new portions of contamination gettering layer 190 are brought into contact with immersion fluid 185 and previously immersed portions of the contamination gettering layer are removed from contact with the immersion fluid. Mask 130 and slit 135 may be moved in the Y direction under the control of controller 110 to scan the image (not shown) on mask 130 onto photoresist layer 200. In one example, the image on mask 130 is a 1× to a 10× magnification version of the image to be printed and includes one or multiple integrated circuit chip images.

When exposure is complete, wafer 210 is removed from controlled environment chamber 105 without spilling immersion fluid 185. To this end, controlled environment chamber 105 also includes a cover plate 225 that may be moved to first abut with wafer chuck 155 and then moved with the wafer chuck as the wafer chuck is moved out of position from under immersion head 150, the cover plate replacing the wafer chuck under immersion head 150.

Thus, the present invention provides a method to prevent interaction between photoresist layers and immersion fluid in an immersion lithography system and to prevent or reduce contaminants in the immersion fluid from contaminating the integrated circuit being fabricated.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of forming an image in a photoresist layer, comprising:
   (a) forming said photoresist layer over a top surface of a substrate;
   after (a), (b) applying a contamination gettering solution comprising (i) a casting solvent immiscible with said photoresist layer, (ii) one or more polymers and (iii) one or more cation complexing agents over an entire top surface of said photoresist layer and then heating said contamination gettering solution to above room temperature to remove said casting solvent to form a contamination gettering topcoat layer, after said heating said one or more polymers are insoluble in water and soluble in aqueous alkaline developer;
   after (b), (c) forming an immersion layer between said contamination gettering topcoat layer and said photomask;
   after (c), (d) exposing said photoresist layer to ultraviolet light through said immersion fluid, through said topcoat layer and through a photomask having opaque and clear regions, said opaque regions blocking said ultraviolet light and said clear regions being transparent to said ultraviolet light, said ultraviolet light changing the chemical composition of regions of said photoresist layer exposed to said ultraviolet light to form an exposed photoresist layer having exposed and unexposed regions; and
   after (d), (e) developing said exposed photoresist layer in aqueous alkaline developer to simultaneously remove said exposed regions of said photoresist layer and said contamination gettering topcoat layer.

2. The method of claim 1, further including, between said providing said substrate and said forming said photoresist layer, forming an anti-reflective coating over a top surface of said substrate, wherein said photoresist layer is formed on a top surface of said anti-reflective coating.

3. The method of claim 1, wherein said immersion fluid includes water.

4. The method of claim 1, wherein said contamination gettering solution comprises a mixture of said casting solvent, said one or more polymers and said one or more cation complexing agents, said casting solvent comprises water, a water alcohol mixture or an alcohol, said one or more polymers are water soluble, and said one or more cation complexing agents are water soluble.

5. The method of claim 1, wherein said contamination gettering solution comprises a mixture of said casting solvent, said one or more polymers and said one or more cation complexing agents, said casting solvent comprises is an organic solvent, said one or more polymers are soluble in said organic solvent, and said one or more cation complexing agents are soluble in said organic solvent.

6. The method of claim 1, wherein said one or more cation complexing agents are attached as pendent groups to one or more of said one or more polymers.

7. The method of claim 1, wherein at least one of said one or more polymers is a co-polymer, said at least one of said one or more cation complexing agents attached as a pendent group to a first monomer of said copolymer and a second monomer of said copolymer having an attached photoresist layer miscible pendent group.

8. The method of claim 1, further including:
between (a) and (b), applying a sealing topcoat layer on a top surface of said photoresist layer said contamination gettering topcoat layer formed on a top surface of sealing topcoat layer; and
(e) includes simultaneously removing said sealing layer with said exposed regions of said photoresist layer and said contamination gettering topcoat layer.

9. The method of claim 8, wherein said sealing layer prevents said immersion fluid penetrating said photoresist layer and components of said photoresist layer leaching into said immersion fluid.

10. The method of claim 1, wherein said cation complexing agents are selected from the group consisting of trans-1,2 diaminocyclohexane-N,N,N',N'-tetracetic acid monohydrate, 1,2-diaminoethane-N,N,N',N'-tetrakis(methylenephosphoric acid), nitriloacetic acid, phytic acid, 1,4,8,12-tetraazacyclopentadecane, acetylacetone, 18-crown-6 ether, ammonium pyrrolidine dithiocarbamate, di-2-pyridyl ketone oxime, 4-benzoyl-3methyl-1-phenyl-2-pyrazolin-5-one and valinomycin.

11. The method of claim 1, wherein said one or more polymers are selected from the group consisting of, hexafluoroalchol-subsituted cyclooefin based polymers and fluorosulfonamide-subsituted cycloolefins based polymers.

12. The method of claim 1, wherein said one or more cation complexing agents complexes one or more cations selected from the group consisting of cations of K, Na, Cu, Fe, Mn, Ni, Co, $NH_4$.

13. The method of claim 1, wherein said one or more cation complexing agents complexes one or more cations selected from the group consisting of cations of K, Na, Ca, Cu, Fe, Mn, Ni, Co, $NH_4$.

14. The method of claim 1, wherein (b) includes:
spin applying a mixture of a casting solvent, one or more water soluble cation complexing agents, and one or more water soluble polymers, said casting solvent selected from the group consisting of water, a water alcohol mixture and alcohol.

15. The method of claim 1, wherein (b) includes:
spin applying a mixture of an organic casting solvent, one or more organic solvent soluble cation complexing agents and one or more organic solvent soluble polymers.

16. The method of claim 1, wherein (b) includes:
spin applying a mixture of a casting solvent and one or more polymers, said cation complexing agents are pendent groups attached to one or more of said one or more polymers, said casting solvent immiscible with said photoresist layer.

17. The method of claim 1, wherein (b) includes:
spin applying a mixture a casting solvent and a polymer having a pendent group that complexes cations and is miscible with said casting solvent.

18. The method of claim 17, wherein said pendent group complexes copper.

19. The method of claim 17, wherein said polymer is polyethylene amidoxime.

20. The method of claim 1, wherein after said heating said one or more polymers are insoluble in water having a pH between about 5 and about 9.

21. The method of claim 1, wherein said one or more polymers is a terpolymer of the monomers methyl methacrylate, methacrylic acid ammonium salt, and tert-butyl methacrylate.

22. The method of claim 1, wherein said one or more polymers are selected from the group consisting of poly(bis-hexafluoroalcholcyclohexane-co-trans-1,2-diaminocyclohexane-N,N,N',N'-tetraaccetic acid) acrylate, poly(bis-hexafluoroalcholcyclohexane-co-bis(cyclohexanone) oxaldihydrazone) acrylate, poly(bis-hexafluoroalcholcyclohexane-co-1,2-cyclohexanedione dioxime) acrylate and polyethylene amidoxime.

* * * * *